July 16, 1974 E. M. GRIEST 3,824,100

TRANSPARENT IRON OXIDE MICROCIRCUIT MASK

Original Filed June 29, 1972

3,824,100

TRANSPARENT IRON OXIDE MICROCIRCUIT MASK

Edward M. Griest, Painted Post, N.Y., assignor to Corning Glass Works, Corning, N.Y.

Continuation of abandoned application Ser. No. 50,668, June 29, 1970. This application July 14, 1972, Ser. No. 271,649
Int. Cl. G03c 5/04, 11/00
U.S. Cl. 96—27 R 10 Claims

ABSTRACT OF THE DISCLOSURE

A transparent mask consisting of a patterned film of alpha $Fe_2O_3$ disposed on a glass substrate. The iron oxide film is substantially transparent to visible light and substantially opaque to ultraviolet light. The mask can therefore be aligned by the visible light passing therethrough and yet be used to expose a pattern in a layer of photoresist which is sensitive to the ultraviolet light passing through portions of the mask where the iron oxide film has been removed.

CROSS-REFERENCE TO RELATED APPLICATION

This is a continuation of Ser. No. 50,668, filed June 29, 1970, now abandoned.

BACKGROUND OF THE INVENTION

This invention relates to masks for use in the projection of light images and more particularly to a method of utilizing a patterned iron oxide film mask for projecting an optical image onto a surface.

Microcircuit masks, which consist of thin patterned films of masking material disposed on transparent substrates, are utilized in well known processes for forming patterns in photosensitive resist. The use of such masks will be briefly described in connection with the exposure of negative resists; however, it is obvious that positive resists may also be selectively exposed through the use of masks. A mask which is suitable for use with the common negative resists contains a reverse image of the desired geometry, i.e., it contains dark areas where the substrate is to be etched. The image side of the mask is placed in direct contact with a resist coated wafer. Illumination of the proper spectral distribution is directed at the upper surface of the mask and passes through the clear areas thereof to impinge on the resist. The exposed areas of the resist become insoluble and remain behind on development, protecting the coated areas during etching. The final microcircuit product is produced by a succession of etching, diffusion and metallizing steps utilizing various patterned masks. At the present state of the art, patterns include line widths and spacing down to about 5 microns. Since device fabrication employs about 6 to 12 masks, each of which must register with the preceding pattern on a semiconductor wafer, and since defects in the final product are generally the sum of the flaws in the individual masks, it is obvious that the masks must be of high quality and that each mask be properly aligned in order to obtain economical yields of semiconductor devices. Preferred masks for use in the above-described process should be transparent in the visible but absorbing in the ultraviolet portion of the spectrum, should be scratch resistant, and should be capable of being photo-fabricated by methods that utilize common photosensitive resists and common acid etchants.

For a long period of time microcircuit masks were made from a fine-grain, silver halide emulsion-type plate. The recently introduced chromium film microcircuit mask is superior to the emulsion-type plate with respect to abrasion resistance and resolution, and it is therefore being increasingly utilized. However, a serious disadvantage is encountered during the use of the standard emulsion and chromium masks, both of which are opaque in the visible region. The aforementioned alignment of the mask pattern with that on the semiconductor wafer is the most painstaking operation in the fabrication of a semiconductor wafer. This step becomes even more difficult with those masks having a large proportion of opaque area, i.e., masks having only small openings available for viewing the underlying structure. Orientation of such masks to the necessary close tolerance becomes a tedious, time-consuming task.

Several masks have been recently developed in an attempt to solve this alignment problem. One type of transparent mask is produced by special post-development processing of high resolution emulsion-type plates to convert the silver halide image to an orange colored pattern which is transparent in the visible while remaining opaque at wavelengths effective in exposure of photoresists. This transparent emulsion-type mask is still subject to the serious abrasion limitation of the original plate.

A newly developed stained glass mask potentially combines the excellent abrasion resistant characteristics of the chromium mask with the transparency advantage of the die-converted emulsion mask. The stained glass mask is made by forming a patterned layer of metal on the surface of a glass substrate and thereafter diffusing the metal into the surface of the glass substrate. This mask is not well suited to the large-scale production of working microcircuit masks since it is made by a six-step process. Moreover, stained glass masks have resolution limitations, and the staining process can be carried out only after the mask pattern is formed.

SUMMARY OF THE INVENTION

The transparent mask of this invention is useful in the projection of optical images. This mask consists of a glass substrate having at least one planar, smooth surface, and a patterned film of alpha $Fe_2O_3$ disposed on the planar surface. The film is substantially transparent to visible light and is substantially opaque to ultraviolet light.

This mask is especially useful in making a pattern in photoresist carried by a body. Since the iron oxide film is transparent to visible light, the body can be observed for alignment purposes, and the photoresist can be exposed to ultraviolet light in accordance with the pattern of the iron oxide film.

BRIEF DESCRIPTION OF THE DRAWINGS

FIG. 1 is a cross-sectional view of a glass substrate utilized in this invention.

FIG. 2 is a cross-sectional view showing a layer of iron oxide disposed on the substrate.

FIG. 3 is a cross-sectional view showing a layer of photoresist on top of the layer of iron oxide.

FIG. 4 is a cross-sectional view showing the exposure of the photoresist by ultraviolet light passing through a mask.

FIG. 5 is a cross-sectional view showing the exposed portions of the photoresist.

FIG. 6 is a cross-sectional view showing the photoresist after the unexposed portions have been removed.

FIG. 7 is a cross-sectional view showing the exposed portions of the iron oxide etched away.

FIG. 8 is a cross-sectional view of the resultant iron oxide mask.

DESCRIPTION OF THE PREFERRED EMBODIMENT

Figures 1, 2, 3, 4, 5, 6, 7, 8:
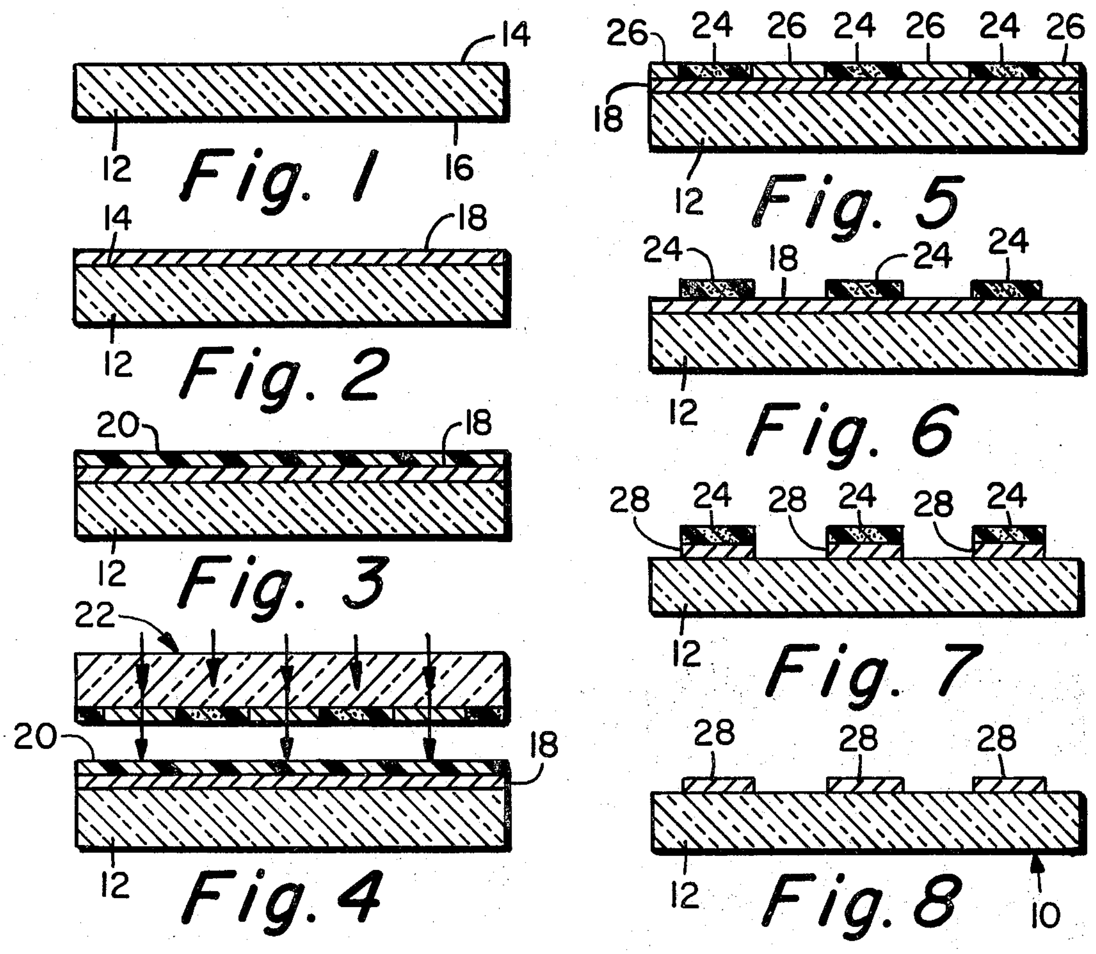
FIGS. 1–8 illustrate various steps in a method which may be used to make the iron oxide mask of this invention.

The transparent mask 10 consists of a substrate 12 of glass which is substantially transparent to visible and to ultraviolet light. The glass to be utilized for the substrate should have good optical characteristics, particularly in the ultraviolet region. Alkali-containing glass substrates can be used for the formation of iron oxide films by the reactive sputtering technique disclosed in U.S. Patent Application Ser. No. 50,670 entitled "Microcircuit Mask and Method" filed in the name of Raymond E. Szupillo on June 29, 1970, now U.S. Pat. No. 3,681,227, since the substrate temperature remains relatively low. One type of glass which may be used in the sputtering method is borosilicate glass of the type disclosed in U.S. Pat. No. 1,304,-623 issued to E. C. Sullivan and W. C. Taylor.

However, substantially alkali-free glass substrates are preferred if the iron oxide film is to be deposited by a method which will subject the substrate to relatively high temperatures. Alkali-free glass should be used when the film is deposited by the vacuum evaporation technique which is described in U.S. Patent Application Ser. No. 50,669 entitled "Method of Forming Thin Films of Alpha $Fe_2O_3$," filed in the name of Raymond E. Szupillo on June 29, 1970, now U.S. Pat. No. 3,695,908, or when the film is deposited by the pyrolytic method described hereinbelow. Alkali-free glass is preferred for use in these two methods since it permits the formation of a better film, the use of such glass preventing a high incidence of pinholes and other deformations of the film which especially occur during the heat treatment portion of the process. By the use of the term, "substantially alkali-free glass substrate," is meant those substrates of glass material typically containing no more than about 0.25% by weight of alkali compounds as compared with the total weight of the material. One of the commercially available glass compositions which meets the above requirements is made from a batch consisting of the following oxides: $SiO_2$—50%, BaO—25%, $Al_2O_3$—10% and $B_2O_3$—15%.

Also, numerous processes well known to those skilled in the art can be employed to remove quantities of alkali compounds from alkali containing glasses. Often, for example, it is possible to remove such compounds from surface portions of otherwise alkali containing glass substrates by using cleaning agents which leach alkali from the surface layers thereof. In such cases alkali containing glasses are within the meaning of the term, "substantially alkali-free glass," as used in this disclosure, where the alkali compounds at or near the surface of the substrate are not greater than 0.25% by weight of the total weight of glass in that region. The region of criticality is that region near the iron oxide filmed surface of the substrate in which the presence of substantial quantities of alkali compounds would produce material alkali contamination of the film as a result of the particular temperature employed.

The substrate 12 can have any desired dimension and can be formed of any suitable thickness, but it should be of such a size and thickness that it can be readily handled. Masks which are utilized for processing microcircuits are usually between 0.050 and 0.100 inch in thickness. The substrate 12 is provided with two spaced parallel planar surfaces 14 and 16. One or both of these surfaces may be polished if necessary and cleaned prior to the step of depositing thereon an iron oxide film as will be hereinafter described.

In accordance with a particularly effective cleaning process, a glass substrate is first soaked in a common laboratory or household detergent at room temperature for five minutes or more. The plate is then swabbed with cotton to remove particulate matter, and thereafter subjected successively to three separate one minute rinses in distilled deionized water to eliminate water spot formations and liquidous surface acidity. Next, the plate is subjected to ultrasonic agitation in a distilled deionized water bath for about five minutes, or more. Thereafter, the plate is again rinsed in distilled deionized water to remove any surface matter which may have been collected on the plate during the foregoing ultrasonic agitation step.

The plate is blown dry with filtered clean dry air to remove water droplets and spots. A conventional vapor degreaser is thereafter used to rinse away any remaining water from the plate with isopropyl alcohol vapor. Finally, the plate is baked in clean filtered dry air for about thirty minutes or more in a temperature range between about 180° C. and 200° C. In the foregoing manner, surface contamination of the plate is substantially reduced thereby eliminating a possible source of film defect formation.

As illustrated in FIG. 2, a continuous film 18 of iron oxide is uniformly deposited on the surface 14 of the glass substrate by any suitable manner such as by vacuum evaporation, chemical fuming or pyrolysis, reactive sputtering or the like. The particular form of iron oxide which is suitable for use as a microcircuit mask film is the fully oxidized form, alpha $Fe_2O_3$, which is known as hematite. Masks could be made from iron oxide films having thicknesses in the range of 500 A. to 5000 A. Since the optical density of thin iron oxide films depends upon the crystalline state and grain size, which are determined by the particular method by which a film is deposited, the thickness range of a masking film of iron oxide is somewhat determined by the deposition technique. If a masking film is too thin, the optical density thereof in the ultraviolet region will be relatively low, therefore requiring a short and very precisely controlled exposure time during use of the mask for exposing resists. If a masking film is too thick, it is less transparent in the visible region and does not provide high resolution exposure of resists. It is therefore preferred that iron oxide films for use as masks be between 1000 A. and 4500 A. thick.

In accordance with one method of depositing film 18, 50 grams of ferric chloride, $FeCl_3 \cdot 6H_2O$, were thoroughly mixed with 50 cubic centimeters of a mixture of water, $H_2O$, and dilute hydrochloric acid, HCl, the latter mixture having about a 5 to 1 ratio by volume of water to hydrochloric acid although such ratio is not critical and may vary 50% in either direction. An alkali-free glass substrate was heated to approximately 625° C. and a surface of the heated substrate was uniformly sprayed, as by a suitable spray gun, with the above-described aqueous solution of ferric chloride. The heat of the substrate drives off the water from the solution and leaves a thin adherent film or coating of alpha iron oxide, $Fe_2O_3$, on the surface of the substrate.

Another method of forming an iron oxide film may be carried out by heating a material such as ferrocene, iron carbonyl, or iron acetyl acetonate to the vapor state and decomposing the vapor to iron oxide on contact with a sufficiently hot substantially alkali-free glass substrate. Moreover, iron oxide films suitable for use as microcircuit masks have also been produced by the vacuum evaporation and reactive sputtering techniques described in the aforementioned co-pending applications.

As shown in FIG. 3, after the iron oxide film 18 is deposited on substrate 12, a thin layer 20 of a suitable photo-resist such as KPR is uniformly applied to the iron oxide surface in any well known manner. The KPR may be baked onto the film in any well known manner to improve its adherence and quality. The term "KPR" refers to Kodak Photo Resist which is a trade name product sold by the Eastman Kodak Company, Rochester, N.Y. A complete description of this and other well known resists and the methods for using them are contained in publication P-7 entitled "Kodak Photosensitive Resists for Industry," copyrighted in 1962 by the Eastman Kodak Company of Rochester, N.Y.

As shown in FIG. 4, the KPR layer is suitably masked to avoid exposure of selected portions thereof to ultraviolet light. A mercury vapor lamp of the type conventionally used in photo-resist exposure work is employed to expose the KPR layer 20 through a conventional mask 22, to transfer the image carried thereby to the KPR to provide ultraviolet exposed portions 24 which, as shown in FIG. 5, form a predetermined pattern in the KPR corresponding to that carried by mask 22. After exposure, the mask 22 is removed and the soluble portions 26 of the KPR are removed in a conventional KPR developer solution such as trichloroethylene, or the like. As shown in FIG. 6, the remaining unsoluble portions 24 of the KPR, being unaffected by the developer solution, remain adhered to the plate to protect selected portions of the iron oxide film during the subsequent acid etching step.

A microcircuit mask pattern is formed by immersing the unit shown in FIG. 6 in a suitable iron oxide etchant such as hydriodic acid which etches iron oxide at rates of 50 to 80 A. per second at room temperature. Raising the temperature of the acid to 40 or 50° C. increases the etch rate, making etch time only a few seconds, e.g., 10–30 seconds. These latter temperatures and times are compatible with both common resists and commercial mask processing standards. A preferred etchant consists of 45 cc. hydroiodic acid, 45 cc. hydrochloric acid, 10 cc. hypophosphorous acid. After the acid etching step, portions 28 of the oxide film remain under the portions 24 of photoresist to form the desired microcircuit mask. After the etching step is completed, the protective KPR mask is removed leaving the iron oxide microcircuit mask 10 shown in FIG. 8.

Figure 9:
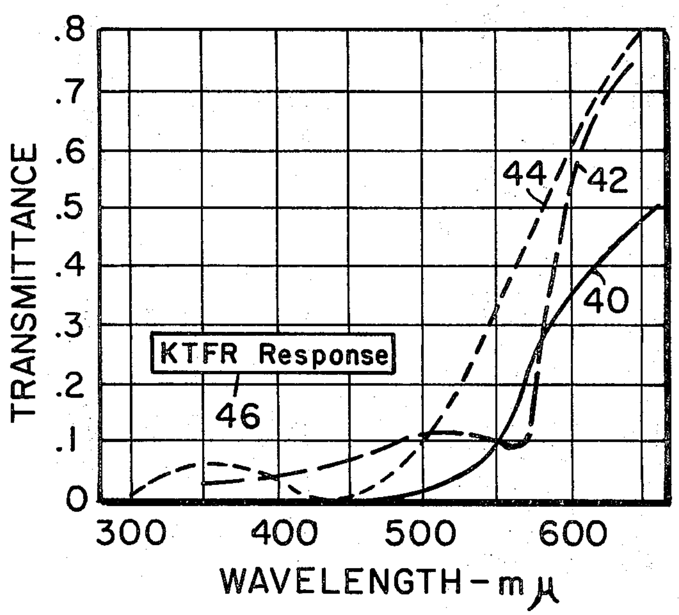
FIG. 9 is a graph illustrating the transmittance characteristics of an iron oxide film and two other transparent masks.

The transmittance characteristics of a pyrolytically deposited iron oxide film are compared with the characteristics of two other transparent masking films in FIG. 9, curves 40, 42 and 44 relating to iron oxide, copper stain and transparent emulsion, respectively. Box 46 illustrates the band of light to which common photosensitive resists such as Kodak Thin Film Resist (KTFR) are sensitive. Curve 40 illustrates that the iron oxide film having a thickness of about 4100 A. is substantially opaque to ultraviolet light below 500 millimicrons and is substantially transparent to visible light above 600 millimicrons. The iron oxide film is reasonably opaque to the strong mercury lines in the photoresist-sensitive region, i.e., at 365 millimicrons and 435.8 millimicrons. Displacement of the transmission curve 40 is possible by varying film thickness. Significantly higher transmission in the visible region may be obtained by use of one or more additional film of suitable refractive indices over the iron oxide film. In this manner, the reflectance at the air-film interface may be reduced similarly to the well known technique for treating camera lenses.

The disclosed iron oxide mask has many advantageous features. Since the iron oxide masking material is optically transparent at wavelengths where most photosensitive resists are not sensitive, and since it is suitably opaque to the shorter wavelengths of light in the ultraviolet region where photosensitive resists react to light energy, it is particularly advantageous for use in the manufacture of microcircuits. In accordance with conventional practice, the transparent mask is provided with a pattern which is aligned face down with a pattern or other indicia carried by a semiconductor body under visible light passing through the pattern carried by the transparent mask. Coarse alignment of the mask with the semiconductor body may be obtained by providing guides or alignment surfaces which contact both the semiconductor body and the mask. After the mask has been aligned with the semiconductor body, the photoresist carried by the semiconductor body is exposed to ultraviolet light which passes from a suitable source through the mask, the semiconductor body thereafter being processed in a conventional manner to provide a plurality of chips or dies, each of which carries an integrated circuit or other semiconductor device. Since the mask can be aligned by the visible light passing therethrough, alignment can be quickly accomplished, and the resolution obtained from such a transparent mask is excellent.

The iron oxide masking material can be deposited in a film which is thin enough that lines narrower than one micron in lateral line dimension can be resolved. Moreover, it is as durable to abrasion or scratching as any known mask material. It reacts sufficiently with one or more common reagents which are compatible with most known photosensitive resist materials so that patterns with clean edge definition can easily be produced.

I claim:

1. A method of projecting an optical image onto a surface comprising projecting a beam of light onto said surface through a mask having a glass substrate which has at least one planar, smooth surface, said substrate being substantially transparent to visible and ultraviolet light and a patterned film of alpha $Fe_2O_3$ disposed on said planar surface, said film being substantially transparent to visible light and substantially opaque to ultraviolet light.

2. The method of claim 1 further comprising the step of aligning said mask with respect to said surface by visible light transmitted by said substrate and said film.

3. A method of photographically exposing a layer of photosensitive resist carried by a body comprising projecting ultraviolet light onto said photosensitive resist through a mask having a glass substrate which has at least one planar, smooth surface, said substrate being substantially transparent to visible and ultraviolet light and a film of alpha $Fe_2O_3$ disposed on said planar surface, said film having a predetermined pattern and being substantially transparent to visible light and substantially opaque to ultraviolet light.

4. The method of claim 3 further comprising, prior to the step of projecting, the step of aligning said mask with respect to said body by visible light transmitted by said substrate and said film.

5. The method of claim 3 wherein said patterned film has a thickness between 1000 A. and 4500 A., said film being substantially opaque to ultraviolet light below 500 millimicrons and being substantially transparent to visible light above 600 millimicrons.

6. The method of claim 5 wherein said patterened film has a resolution better than one micron in lateral line dimension.

7. The method of claim 6 wherein said substrate consists of substantially alikali-free glass.

8. A mask for use in the photographic exposure of photosensitive resists comprising a glass substrate having at least one polished planar surface and a film of alpha $Fe_2O_3$ on said surface, the thickness of said film being between 1000 A. and 4500 A., said substrate being substantially transparent to visible and ultraviolet light and said film being substantially transparent to visible and substantially opaque to ultraviolet light, so that the body can be viewed through said film and so that the photosensitive resist can be exposed to ultraviolet light in accordance with the pattern of said film.

9. A mask in accordance with claim 8 wherein said pattern has a resolution better than one micron in lateral line dimension.

10. A mask in accordance with claim 9 wherein said substrate consists of substantially alkali-free glass.

References Cited

UNITED STATES PATENTS

| | | | |
|---|---|---|---|
| 3,695,908 | 10/1972 | Szupillo | 117—124 A |
| 3,508,982 | 4/1970 | Shearin | 96—27 R |
| 3,561,963 | 2/1971 | Kiba | 96—38.3 |
| 3,592,649 | 7/1971 | Parsonage et al. | 96—38.3 |
| 3,625,728 | 12/1971 | Blome et al. | 117—34 R |

DAVID KLEIN, Primary Examiner

U.S. Cl. X.R.

95—1 R; 96—36.2, 38.3